(12) United States Patent
Friesen et al.

(10) Patent No.: US 11,646,517 B2
(45) Date of Patent: May 9, 2023

(54) PLUG CONNECTOR

(71) Applicant: HARTING Electric Stiftung & Co. KG, Espelkamp (DE)

(72) Inventors: Markus Friesen, Espelkamp (DE); Till Riechmann, Espelkamp (DE); Felix Loske, Espelkamp (DE); Inga Heile, Espelkamp (DE); Christian Vollmer, Herford (DE)

(73) Assignee: HARTING Electric Stiftung & Co. KG, Espelkamp (DE)

( * ) Notice: Subject to any disclaimer, the term of this patent is extended or adjusted under 35 U.S.C. 154(b) by 95 days.

(21) Appl. No.: 17/593,781

(22) PCT Filed: Mar. 16, 2020

(86) PCT No.: PCT/DE2020/100201
§ 371 (c)(1),
(2) Date: Sep. 24, 2021

(87) PCT Pub. No.: WO2020/192836
PCT Pub. Date: Oct. 1, 2020

(65) Prior Publication Data
US 2022/0190499 A1 Jun. 16, 2022

(30) Foreign Application Priority Data
Mar. 25, 2019 (DE) ...................... 10 2019 107 573.4

(51) Int. Cl.
*H01R 12/00* (2006.01)
*H01R 12/71* (2011.01)
(Continued)

(52) U.S. Cl.
CPC ....... *H01R 12/714* (2013.01); *H01R 12/7017* (2013.01); *H01R 12/732* (2013.01); *H01R 13/2407* (2013.01); *H01R 13/2478* (2013.01)

(58) Field of Classification Search
CPC .............. H01R 12/714; H01R 13/4538; H01R 13/5208; H01R 13/5213; H01R 13/5205; H01R 13/4534
See application file for complete search history.

(56) References Cited

U.S. PATENT DOCUMENTS

| 4,734,050 A | * | 3/1988 | Negre | ...................... H01R 9/05 439/578 |
| 5,306,158 A | | 4/1994 | Endo et al. | |

(Continued)

FOREIGN PATENT DOCUMENTS

| DE | 4312091 C2 | 2/1996 |
| DE | 10203150 A1 | 7/2003 |

(Continued)

*Primary Examiner* — Phuong Chi Thi Nguyen
(74) *Attorney, Agent, or Firm* — Smartpat PLC

(57) ABSTRACT

A plug connector provides an electrical connection to a conductor track connection of a printed circuit board. The plug connector has a first printed circuit board with a conductor track connection and a plugging region for plugging the printed circuit board into the plug connector. The plugging region extends parallel to the first printed circuit board. A contact element and/or a spring element is provided in the plug connector. The plugging region and the contact element and/or the spring element are arranged in such a way that, in a plugged state of the plug connector, the printed circuit board which is plugged into the plugging region is arranged parallel to the printed circuit board and the conductor track connection is arranged opposite the conductor track connection. An electrical connection of the conductor track connection to the conductor track connection is provided by the contact element and/or the spring element.

15 Claims, 6 Drawing Sheets

(51) Int. Cl.
   *H01R 12/70*    (2011.01)
   *H01R 12/73*    (2011.01)
   *H01R 13/24*    (2006.01)

(56) References Cited

U.S. PATENT DOCUMENTS

| | | |
|---|---|---|
| 5,741,148 A | 4/1998 | Biernath |
| 6,220,871 B1 | 4/2001 | Otsuki et al. |
| 6,878,016 B2 * | 4/2005 | Wulff ................ H01R 13/2471 |
| | | 439/700 |
| 9,033,743 B2 * | 5/2015 | Kobayashi ......... H01R 13/2492 |
| | | 439/637 |
| 9,484,656 B2 * | 11/2016 | Doi ...................... H01R 12/716 |
| 10,243,291 B2 * | 3/2019 | Shibuya ............... H01R 12/716 |
| 2003/0143873 A1 | 7/2003 | Burmeister |
| 2006/0281361 A1 | 12/2006 | Uchida et al. |
| 2006/0286858 A1 | 12/2006 | Uchida et al. |
| 2013/0319739 A1 | 12/2013 | Arnold |
| 2014/0335706 A1 | 11/2014 | Fan et al. |

FOREIGN PATENT DOCUMENTS

| | | |
|---|---|---|
| DE | 102016205939 A1 | 10/2017 |
| FR | 2775373 A1 | 8/1999 |
| JP | S6116485 A | 1/1986 |
| JP | S639772 U | 1/1988 |
| WO | 2004098249 A1 | 11/2004 |

* cited by examiner

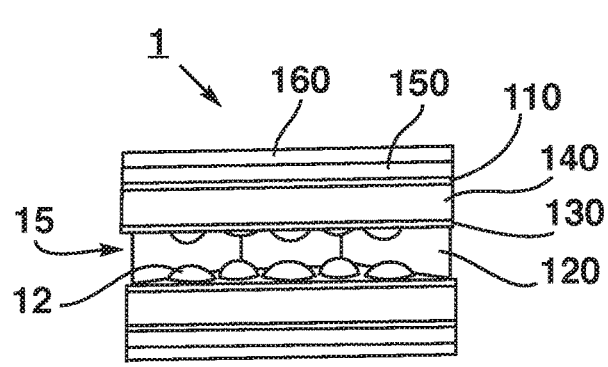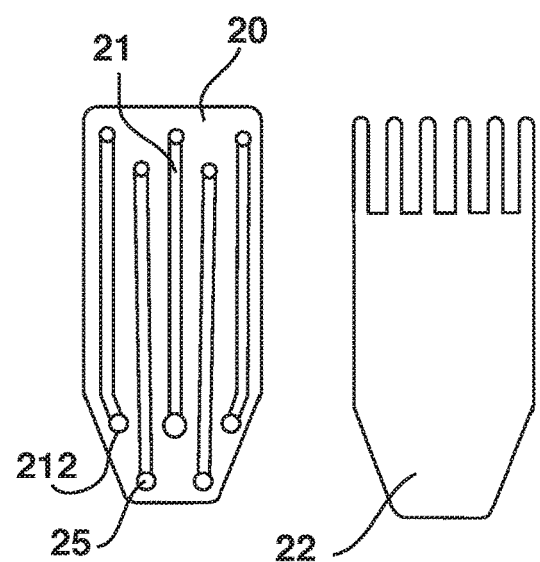
Fig. 4A
Fig. 4B
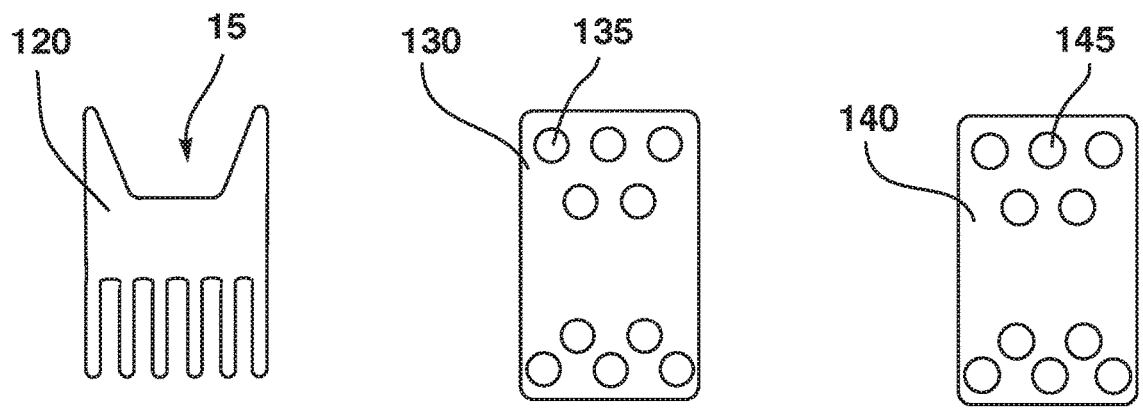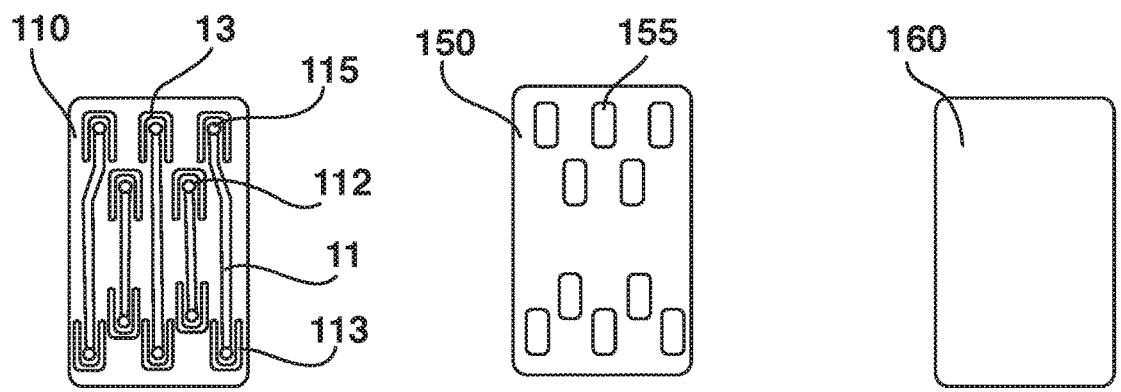
Fig. 4C

PLUG CONNECTOR

TECHNICAL FIELD

The disclosure relates to a plug connector and in particular to a printed circuit board plug connector, and a printed circuit board that is provided with a plug connector.

BACKGROUND

Printed circuit board connectors are required so as to electrically contact a printed circuit board.

In this case, the plug connector is plugged onto a printed circuit board so as to electrically connect a plug connector to the printed circuit board. For this purpose, a multiplicity of plug connector solutions are known, wherein a plug-in socket or a plug-in strip is mounted on the printed circuit board and a correspondingly formed mating plug connector is plugged into said plug-in socket or plug-in strip.

However, in this case the plug connector is frequently not directly connected to the printed circuit board. In order to electrically connect the plug connector to the printed circuit board, the plug connector is generally plugged into a base strip which is electrically connected to the printed circuit board and said plug connector is latched to the plug-in strip by way of latching devices.

The publication DE 43 12 091 C2 discloses a printed circuit board plug connector for connecting a printed circuit board to a plug, wherein in each case a conductor track connection of the printed circuit board produces an electrical contact to the respective contact spring of the plug. A plug housing comprises an intermediate wall that stands in a perpendicular manner with respect to the direction in which the printed circuit board and the plug are connected and in which an insertion opening is formed.

A guiding housing for receiving the printed circuit board mating area is arranged with its open side against the plug-in opening of the intermediate wall, wherein the guiding housing has connection openings for connecting the contact springs to the conductor tracks. Guiding ribs are provided on the guiding housing so as to guide the contact springs between the respective connection openings during the plug-in procedure.

The construction of the printed circuit board plug connector proposed by the publication DE 43 12 091 C2 is disadvantageously enlarged by its plug connector housing and its guiding housing and is costly to produce.

SUMMARY

An object of the invention is to propose a compact plug connector and in particular a printed circuit board plug connector that is suitable for many applications and can be produced in a simple and cost-effective manner. In this case, a further object of the invention is to provide a printed circuit board that is provided with a plug connector.

The object is achieved by the plug connector as claimed. Advantageous embodiments are disclosed in the dependent claims and/or the description below.

The present disclosure relates in particular to a first plug connector for providing an electrical connection of a conductor track connection of a printed circuit board to a conductor track connection of a printed circuit board that is to be contacted, wherein in a suitable manner the first printed circuit board is a component of the first plug connector.

The first plug connector has a mating area for plugging in the printed circuit board that is to be contacted into the first plug connector, wherein the mating area extends parallel to the first plug connector.

The above-mentioned features provide in an advantageous manner the possibility of producing an electrical connection of the above-mentioned conductor track connections, wherein their printed circuit boards are arranged parallel to one another. In this manner, the first plug connector can be embodied in a particularly compact manner, which is moreover benefited by virtue of the fact that the first printed circuit board is a component of the first plug connector.

A contact element and/or a spring element is provided in the first plug connector in particular on the conductor track connection of the first printed circuit board so as to provide the electrical connection of the conductor track connection of the first printed circuit board to the conductor track connection of the printed circuit board that is to be contacted.

The mating area, the contact element and/or the spring element are in this case embodied and arranged in such a manner that the printed circuit board that is to be contacted and is plugged into the mating area is arranged parallel to the first printed circuit board and an electrical connection of the conductor track connection of the first printed circuit board to the conductor track connection of the printed circuit board that is to be contacted is provided by way of the contact element and/or the spring element.

As mentioned above, a first plug connector having the above-mentioned features renders possible a particularly compact construction of the plug connector that is desirable for many applications.

The contact element and the spring element can in this case be embodied as one piece, which likewise benefits a compact construction of the plug connector.

Moreover, the contact element and/or the spring element can be embodied and arranged suitably in such a manner that as the printed circuit board that is to be contacted is plugged into the mating area a force that acts in this case parallel to the first printed circuit board triggers a force that acts in such a perpendicular manner with respect to the first printed circuit board and/or the printed circuit board that is to be contacted that the contact element and/or the spring element is clamped between the printed circuit boards that are arranged parallel to one another. It is possible in this manner to provide an advantageously particularly reliable electrical and mechanical contact of the contact element and/or the spring element to the said conductor track connections of the printed circuit boards.

The mating area can be a cut-out that is embodied in a second synthetic material plate, wherein the second synthetic material plate can be arranged in this case suitably in a sandwich-like manner between a first and third synthetic material plate and wherein the first, second and third synthetic material plate extend advantageously parallel to the first printed circuit board.

The first printed circuit board is arranged in this case in a suitable manner on the third synthetic material plate, wherein a cut-out for accommodating the contact element and/or the spring element can be advantageously embodied in the third synthetic material plate.

The above-mentioned features also render it possible to produce a particularly simple and compact construction, wherein furthermore a first plug connector of this type can be provided cost-effectively in a simple manner.

The cut-out that is embodied in the third synthetic material plate is embodied and arranged in this case suitably in such a manner that a contact element and/or spring element accommodated in said cut-out is in contact with the conductor track connection of the first printed circuit board and extends by a predetermined amount into the mating area.

The contact element can also be embodied in a particularly simple manner as one piece with the spring element. For example, it is possible to arrange in the cut-out of the third synthetic material plate a leaf spring or a helical spring that is provided with contact pads.

It is particularly advantageous that the first printed circuit board can have a predetermined amount of flexibility, wherein the spring element can be a leaf spring element that is provided by means of a U-shaped cut-out that is embodied in the first printed circuit board. The U-shaped cut-out encompasses the spring element in this case and the conductor track connection is arranged on the spring element. The cut-out can also be embodied in an S-shaped manner.

The above-mentioned advantageous one-piece design of the spring element with the first printed circuit board renders it possible to minimize as desired the components of the first plug connector and in so doing likewise benefits a compact construction that furthermore can be produced in a particularly simple manner. The U-shaped cut-out can be milled into the first printed circuit board during the production of the first printed circuit board.

A predetermined thin third synthetic material plate can be provided so as to provide a desirable flat construction of the first plug connector. In so doing, it is possible to arrange on the spring element that is embodied as one piece with the first printed circuit board a contact pad that has a predetermined thickness on the conductor track connection of the first printed circuit board in such a manner that the contact pad extends into the mating area by a predetermined amount beyond the cut-out that is embodied in the third synthetic material plate in such a manner that the contact pad in the plugged-in state of the plug connector provides a contact to the conductor track connection of the printed circuit board that is to be contacted.

In this manner, a particularly simple contact element is formed by means of the above-mentioned contact pad, whereby moreover it is possible to achieve a further advantageous minimization of the construction height and components of the plug connector.

A fourth synthetic material plate can be arranged on the first printed circuit board in a suitable manner with the result that a cover is provided on the first printed circuit board so as to protect as desired the first printed circuit board. In particular in the case of the above-described one-piece design of the spring element with the first printed circuit board, the fourth synthetic material plate can in this case in a suitable manner have a cut-out for accommodating in particular an actuated and/or deflected spring element.

As mentioned in the introduction, the contact element can be provided in a suitable manner by means of a component that is accommodated in the cut-out that is embodied in the third synthetic material plate, wherein the contact element can be in particular advantageously a metal sphere or a metal cylinder.

In so doing, it is possible to embody in the above-mentioned spring element that is in one-piece with the first printed circuit board a circular cut-out having a conductive edge by means of which the conductor track connection is provided. The contact element that is embodied as a sphere has in this case a contour that advantageously cooperates with the circular cut-out with the result that a desirable electrical contact of the contact element to the circular conductor track connection is provided. In so doing, the sphere cooperates advantageously in a positive-locking manner with the circular or annular conductor track connection.

A contact element that is embodied as a sphere is in particular also of advantage in the case of a conductor track connection of the printed circuit board that is to be contacted, said conductor track connection likewise being embodied in a circular manner corresponding to the above-mentioned circular conductor track connection of the first printed circuit board, and a latching arrangement of the plugged-in printed circuit board that is to be contacted can be provided by means of said contact element.

So as to better understand the invention, a plugging-in procedure of the printed circuit board that is to be contacted into the mating area that is provided for said printed circuit board in the first plug connector is described here below using as an example the contact element that is embodied as a sphere and the spring element that is embodied as one-piece with the first printed circuit board. For this purpose, the printed circuit board that is to be contacted and the cut-out that forms the mating area have in a suitable manner contours that correspond in a positive-locking manner to the contact element, which also applies for advantageous embodiments that are different from the described example.

The contact element that is embodied as a sphere, the third synthetic material plate and the spring element are in this case embodied and arranged suitably in such a manner that the contact element in the unplugged state of the first plug connector extends by a predetermined amount into the mating area.

In this case, in a suitable manner, the cut-out that is embodied in the third synthetic material plate and that accommodates the contact element tapers in an area that is adjacent to the mating area and comprises on the mating area a circular edge that can be provided with a metal layer. The above-mentioned circular edge corresponds in a positive-locking manner in such a manner to the contact element that is embodied as a sphere that the contact element lies on the circular edge and extends by the said predetermined amount with a section into the mating area.

In this case, in a suitable manner, the third synthetic material plate and the spring element are embodied and arranged in such a manner that the contact element corresponds in a positive-locking manner to the circular conductor track connection of the first printed circuit board in such a manner that an annular electrical and mechanical contact of the contact element to the conductor track connection is provided.

In this case, the cut-out that is embodied in the third synthetic material plate is widened in this manner in its further course with respect to the above-mentioned area that is adjacent to the mating area and is embodied in a positive-locking manner with the contact element that is embodied as a sphere for example in a cylindrical manner. As the printed circuit board that is to be contacted is plugged in, the contact element is displaced by means of a force that in this case acts in a positioning manner extending into the mating area and parallel to the first printed circuit board from the printed circuit board that is to be contacted in the cylindrical cut-out in a perpendicular manner with respect to the first printed circuit board.

In the case of the above-mentioned perpendicular displacement of the contact element, a force that is directed in a perpendicular manner with respect to the first printed circuit board now acts on the spring element, whereupon which the spring element is deflected into the cut-out that is embodied in the fourth synthetic material plate and wherein the spring element exerts a corresponding counter force that is directed in a perpendicular manner with respect to the mating area onto the contact element.

The spherical design of the contact element is in this case in particular also particularly advantageous after a friction that occurs between the printed circuit board that is to be contacted and the contact element causes the sphere to roll. As the printed circuit board that is to be contacted continues to be plugged into the mating area, the force that is required for plugging in the printed circuit board that is to be contacted can therefore be small as desired and furthermore can be maintained approximately constant. In this manner, it is also possible in particular to maintain advantageously small a resistance of the contact element in the case of the first mechanical contact of the printed circuit board that is to be contacted with the contact element.

As mentioned above, a circular conductor track connection can be embodied on the first printed circuit board, said conductor track connection cooperating in a positive-locking manner with the contact element, wherein the conductor track connection of the printed circuit board that is to be contacted can likewise be embodied by means of a suitable circular edge of a cut-out in the printed circuit board that is to be contacted.

As the printed circuit board that is to be contacted continues to be plugged-in, the contact element, which in this case is being displaced in the direction toward the first printed circuit board, slides and/or rolls on a side of the printed circuit board that is to be contacted, wherein a resilient force of the spring element pushes the contact element in a perpendicular manner with respect to the printed circuit board that is to be contacted onto the printed circuit board that is to be contacted.

The mentioned circular cut-out in the printed circuit board that is to be contacted is embodied and arranged in this case in the fully plugged-in state in such a manner corresponding to the cut-out that is embodied in the third synthetic material plate and to the contact element that the contact element is pushed by the spring element into the circular cut-out of the printed circuit board that is to be contacted if a plugged-in state of the first plug connector is provided with a latching arrangement.

In the case of the above-described arrangement of the first plug connector, in the plugged-in state, an electrical connection of the conductor track connections of the two printed circuit boards that are arranged parallel to one another is advantageously provided by means of the described arrangement and design of the first printed circuit board and the printed circuit board that is to be contacted. Moreover, in this case, a latching arrangement of the first plug connector with the printed circuit board that is to be contacted is provided, whereupon the contact element has a particularly advantageous dual function.

The above-described plugging-in procedure of the printed circuit board that is to be contacted into the mating area that is provided in the first plug connector has been described with reference to an advantageous exemplary embodiment of the invention of the contact element that is embodied as a sphere and of the spring element that is embodied as one piece with the printed circuit board.

The above-described advantages of this exemplary embodiment can also be achieved with modified embodiments, wherein in this case likewise by way of example a cylindrical design of the contact element with correspondingly further modified embodiments of the cut-out that is embodied in the third synthetic material plate and of the conductor track connections is mentioned.

A cost-effective first printed circuit board and printed circuit board that is to be contacted and which can also be populated with components in a simple manner using current methods can be advantageously provided by means of a single-layer or multi-layer standard printed circuit board.

Furthermore, the first and/or second and/or third and/or fourth synthetic material plate can be provided in a suitable manner in each case by means of at least one copper-free printed circuit board.

The second synthetic material plate can in this case be formed by a second printed circuit board, wherein the mating area is embodied as a cut-out in the second printed circuit board.

The third synthetic material plate can be formed in a suitable manner by a third and fourth printed circuit board, wherein a cut-out is embodied in each case in the third and fourth printed circuit board. The cut-out that is embodied in the third printed circuit board and the cut-out that is embodied in the fourth printed circuit board can be embodied in this case in a simple manner differently such that a cut-out for accommodating the contact element and/or the spring element is provided and said cut-out accommodates the contact element and/or the spring element in such a displaceable manner that the contact element and/or the spring element is held by a contour that is embodied in the third printed circuit board and furthermore said contact element protrudes by a predetermined amount into the mating area of the first plug connector.

In a suitable manner, it is possible in particular in the case of a cut-out that is embodied in a cylindrical manner in each case in the above-mentioned third and fourth printed circuit board to taper the cut-out in an area that is adjacent to the mating area in particular in such a manner that the cylindrical cut-out of the third printed circuit board is provided with a comparatively tapered diameter and in so doing furthermore has a predetermined thickness.

In this manner the above-mentioned cut-out that is embodied in the third synthetic material plate and is particularly suitable for accommodating a spherical contact element can be provided in a particularly simple manner by the cut-out that is embodied in the third and fourth printed circuit board. The first printed circuit board can in this case be arranged in a suitable manner on the above-mentioned fourth printed circuit board, wherein the third printed circuit board is arranged on the second printed circuit board. The above-mentioned cut-outs can be embodied in a simple manner by means of a milling or drilling procedure.

In this case, it is clear from the above-mentioned description that the cut-out that is embodied in the third printed circuit board is arranged adjacent to and in contact with the mating area, wherein the contact element is arranged in the cut-out that is embodied in the fourth printed circuit board and as described above with reference to an advantageous embodiment of the contact element protrudes beyond the cut-out that is embodied in the third printed circuit board by a predetermined amount into the mating area.

The fourth synthetic material plate can be formed by a fifth and sixth printed circuit board that are arranged one above the other, wherein the fifth printed circuit board is arranged on the fourth printed circuit board and wherein a cut-out for accommodating the above-described spring element that is embodied as one piece with the first printed circuit board is embodied in a suitable manner in the fifth printed circuit board.

The above-described third, fourth, first, fifth and sixth printed circuit board can arranged one above the other in this sequence in a suitable manner form a printed circuit board stack.

Furthermore, the above-described first synthetic material plate, which is arranged adjacent to the mating area and adjacent to which the second synthetic material plate is arranged, can be formed by a seventh printed circuit board, wherein the second printed circuit board is arranged on the seventh printed circuit board.

In the case of the above-mentioned embodiment of the invention, a first above-described printed circuit board stack is arranged on a side of the second printed circuit board, wherein the third printed circuit board of the printed circuit board stack is arranged on a side of the second printed circuit board and the seventh printed circuit board is arranged on the other side of the second printed circuit board.

It is possible in lieu of the seventh printed circuit board to arrange on a side of the second printed circuit board a second above-described printed circuit board stack that in a similar manner to the first printed circuit board stack likewise has a said third, fourth, first, fifth and sixth printed circuit board that are stacked one above the other in this sequence, wherein the third printed circuit board of the second printed circuit board stack is arranged on a side of the second printed circuit board.

In this manner, it is possible in a simple manner to provide an advantageous first plug connector according to one embodiment of the invention, wherein said first plug connector has two first printed circuit boards having a conductor track connection so as to provide an electrical connection to a conductor track connection of the printed circuit board that is to be contacted.

The first and second printed circuit board stack can be embodied differently in particular also in the arrangement and design of the conductor tracks and/or of the conductor track connections of the first printed circuit boards and/or of the contact element and/or of the spring element. The first and second printed circuit board stack can also be embodied in an identical manner, whereupon first the plug connector that has two first printed circuit boards can be embodied in a mirror-symmetrical manner with respect to its second printed circuit board that is arranged in the middle.

The described printed circuit boards can also be provided in each case by means of multiple printed circuit boards, wherein a simple design of the thickness of the functional printed circuit boards of the first plug connector is possible.

The printed circuit board that is to be contacted can advantageously be a component of a second plug connector, whereupon the invention moreover relates in particular to a second plug connector for providing an electrical connection of a conductor track connection of the printed circuit board that is to be contacted to a conductor track connection of a further printed circuit board. The further printed circuit board can be in this case in a suitable manner a first printed circuit board of the above-described first plug connector.

In a suitable manner, the second plug connector has a housing that has at least two synthetic material plates and can be provided by means of a printed circuit board stack. The at least two synthetic material plates can be provided in each case by means of at least one copper-free printed circuit board.

The printed circuit board that is to be contacted is in this case arranged in a sandwich-like manner between the at least two synthetic material plates and/or printed circuit boards and protrudes with its mating area out of the housing of the second plug connector so as to facilitate the first plug connector being plugged into the mating area.

The conductor track connection of the printed circuit board that is to be contacted of the second plug connector can be provided as mentioned above in particular by means of an edge of a cut-out that is embodied in the printed circuit board that is to be contacted, wherein moreover a latching element for latching with the first plug connector can be provided by means of the conductor track connection.

The printed circuit board that is to be contacted of the second plug connector can have a multiplicity of conductor tracks and/or conductor track connections, wherein the conductor tracks and/or the conductor track connections can be embodied on both sides of the printed circuit board that is to be contacted. The above-mentioned statements also apply in a similar manner accordingly for the first printed circuit board of the above-described first plug connector.

The first and second plug connector can be modified in this case for a predetermined design and/or a predetermined functionality in a simple manner for many applications optimized by means of for example providing a predetermined number of also redundant conductor track connections that are also arranged in the plugging-in direction adjacent to one and/or one behind the other and/or in sequence.

The printed circuit board that is to be contacted of the second plug connector can have on its mating area a contour by means of which the second plug connector is provided with a coding, wherein the contour can be embodied in a manner that corresponds to an inner contour of a mating area of the first plug connector. This feature also renders possible a selected design of the first and second plug connector that is optimized to suit a predetermined application.

The printed circuit board that is to be contacted of the second plug connector can be provided on one side or on both sides with at least one conductor track connection. Alternatively, two printed circuit boards that are to be contacted can also be assembled arranged one above the other, wherein their sides that are provided with a conductor track connection are arranged opposite one another.

By means of the second plug connector, it is possible to provide as described above a mating plug connector of the first plug connector.

A suitable printed circuit board of the first and second plug connector and which does not have a conductor track can also be provided in particular in a cost-effective manner by means of a copper-free standard printed circuit board that is available as industrial standard with a thickness of 0.5 mm to 3.2 mm. The described cut-outs in the printed circuit board can be embodied in a suitable manner by means of milling as through-going holes in the printed circuit boards.

The synthetic material plates or the copper-free printed circuit boards can be provided in a cost-effective manner as mentioned above by means of advantageously simple printed circuit boards, the surfaces of which do not require any copper. In particular FR4 printed circuit boards that render possible a particularly stable and fire-resistant housing are suitable for this purpose.

The printed circuit boards of an above described first and second plug connector can be adhered to one another in a simple manner, whereby a housing of the first and second plug connector is provided. Instant glue can be used for example and advantageously as a suitable adhesive.

A first printed circuit board of the first plug connector and a printed circuit board that is to be contacted of the second plug connector can be populated on one side or on both sides with electrical and/or electronic components, wherein corresponding cut-outs for accommodating the components can be embodied in a suitable manner by means of milling into the printed circuit boards that are arranged adjacent correspondingly to the first and the printed circuit board that is to be contacted. Components of an electronic sensor system are mentioned here as exemplary and advantageously suitable electrical and/or electronic components.

The above-mentioned feature also renders it advantageously possible to provide a plug connector that is embodied in an optimized manner for a predetermined application and has a predetermined functionality.

The cut-outs for accommodating the components can be cast with synthetic material with the result that the components that are arranged in the cut-outs are protected against vibrations. A synthetic resin that is suitable for casting the cut-outs can be for example an epoxy resin.

It is clear that the printed circuit boards of the first and second plug connector and which are provided with conductor tracks can also be soldered to cables or can have more than one mating area. Mentioned here as an example is a plug connector that is embodied on its one side as a first plug connector and on its opposite side as a second plug connector.

The above-described in particular first plug connector is particularly suitable to render possible an electrical contact on an edge of a printed circuit board, whereupon the invention relates moreover in particular to a printed circuit board, the edge of which is provided with at least one above-described second plug connector. It is possible in order to achieve a desirable further possibility of contacting the printed circuit board to embody furthermore at least one first plug connector on the edge of the printed circuit board. In so doing, the printed circuit board is embodied advantageously in each case as one piece with a first printed circuit board of the second plug connector and/or with a printed circuit board that is to be contacted of the second plug connector.

An above-described first and second plug connector can be designed as mentioned above advantageously optimized in numerous ways for many applications. Examples are also mentioned below with the aid of exemplary embodiments with reference to the drawings.

BRIEF DESCRIPTION OF THE DRAWINGS

Exemplary embodiments of the invention are illustrated in the drawings and further explained below.

FIG. 4A illustrates shows a plan view of the plug-in opening of the mating area of the first plug connector shown in FIG. 3A;

FIG. 4B illustrates a plan view of printed circuit boards that are suitable for the second plug connector shown in FIG. 3A;

FIG. 4C illustrates a plan view of printed circuit boards of the first plug connector shown in FIG. 3A;

DETAILED DESCRIPTION

Figure 1A:
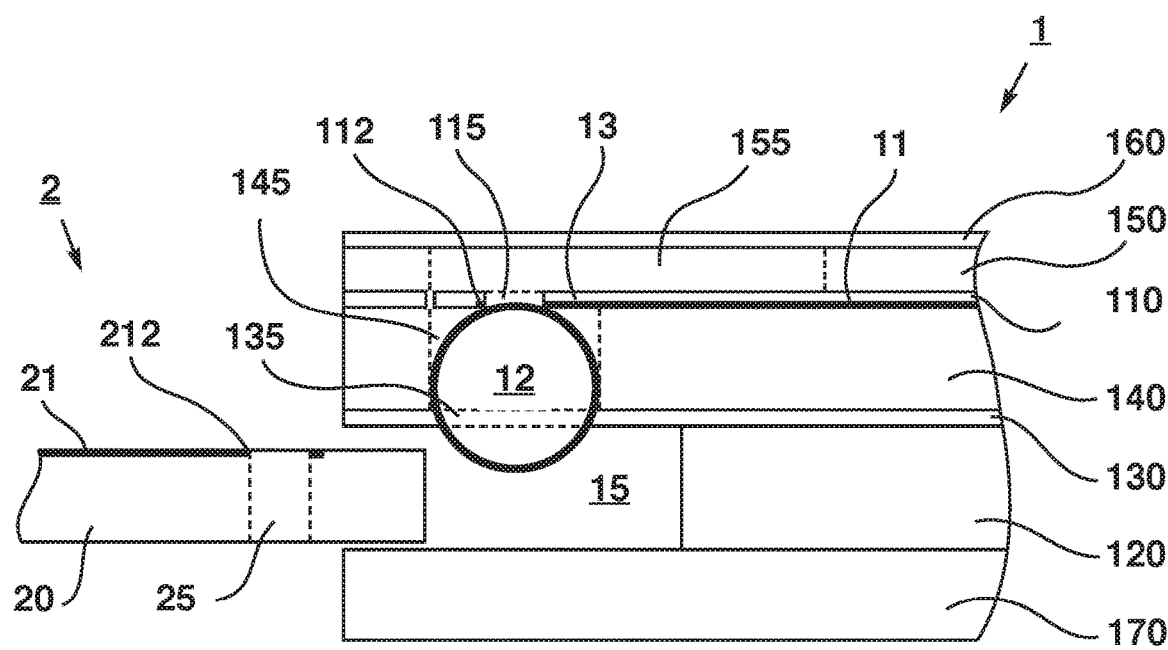
FIG. 1A illustrates a sectional view through a section of a plug connector according to one embodiment of the invention.

The figures illustrate in part simplified schematic views. In part, identical reference numerals are used for similar but possibly not identical elements. Different views of the same elements could be scaled differently.

Figure 1B:
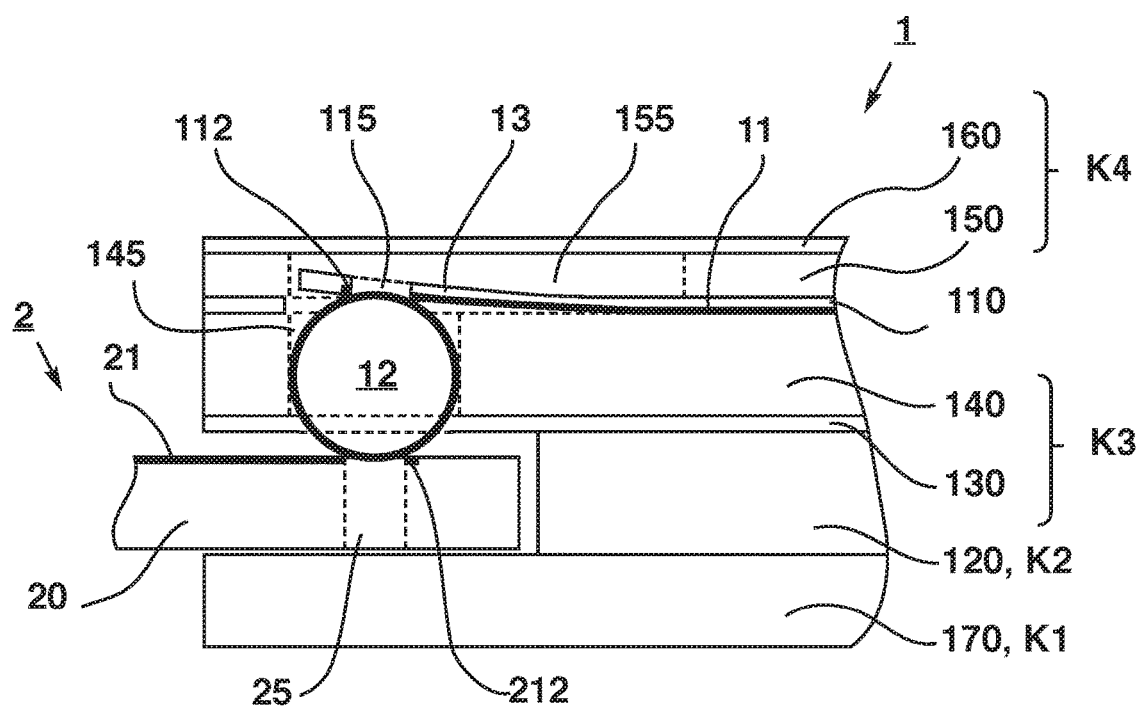
FIG. 1B illustrates in the plugged-in state the plug connector shown in FIG. 1A.

FIG. 1A illustrates a sectional view through a section of a plug connector 1 according to one embodiment of the invention together with a mating area of a printed circuit board that is to be contacted 20 by means of the plug connector 1. FIG. 1B illustrates in the plugged-in state the plug connector 1 and the printed circuit board that is to be contacted 20 shown in FIG. 1A.

The plug connector 1 has as described in the introduction a seventh 170, second 120, third 130, fourth 140, first 110, fifth 150 and sixth 160 printed circuit board that are arranged one above the other in this sequence. The above-mentioned printed circuit boards can be adhered to one another and provide a housing of the plug connector 1.

The first printed circuit board 110 has a conductor track 11, the end of which is provided with a conductor track connection 112. The conductor track connection 112 is provided by means of a circular edge that is embodied on a circular cut-out 115 of the printed circuit board 110. The first printed circuit board 110 has moreover a predetermined amount of flexibility and is arranged on the fourth printed circuit board 140 with its conductor track 11 adjacent to the fourth printed circuit board 140.

Figure 2:
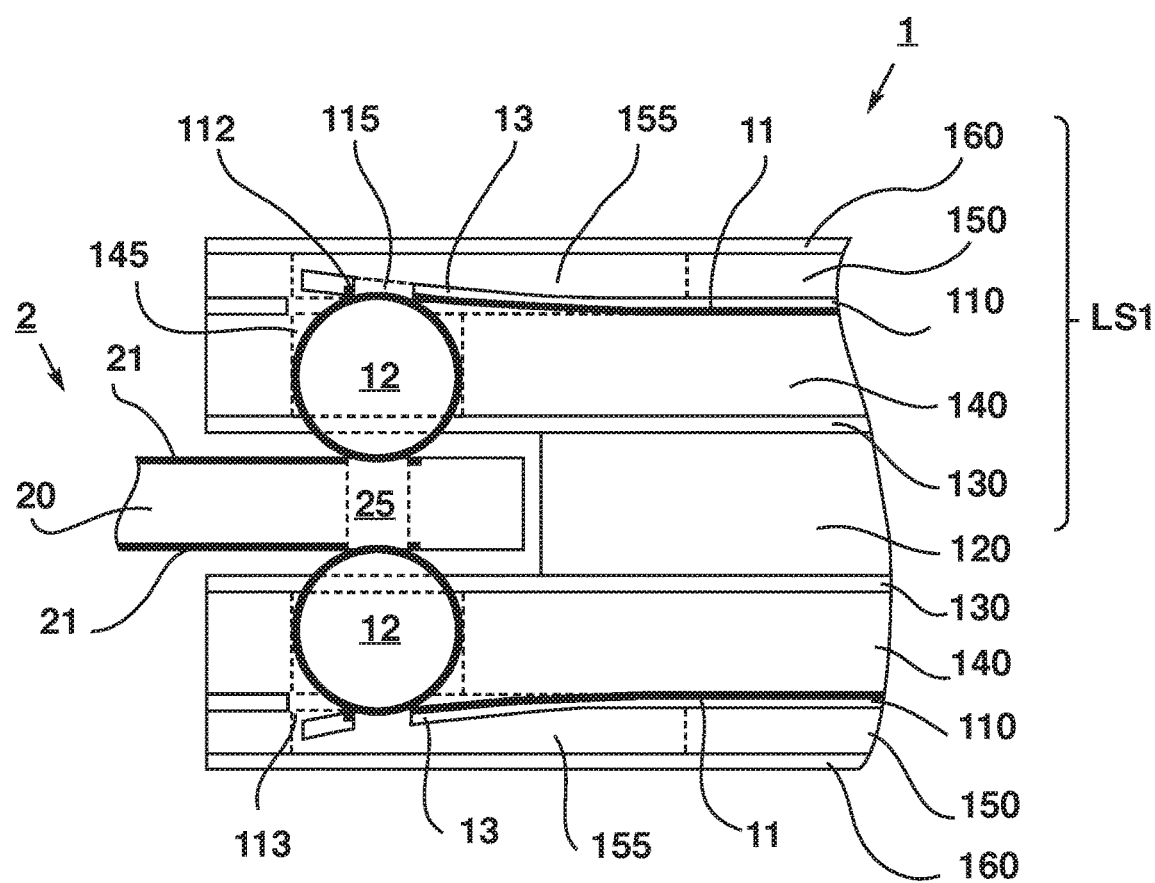
FIG. 2 illustrates a sectional view through a section of a plug connector according to one embodiment of the invention in the plugged-in state.

Moreover, a U-shaped cut-out 113 that encompasses the conductor track connection 112 is embodied in the first printed circuit board 110. Reference is also made here to FIG. 2 and FIG. 4C with respect to the U-shaped cut-out. A leaf-shaped section of the printed circuit board 110 is left free on three sides by means of the U-shaped cut-out. In this manner, a spring element 13 is provided that is embodied as a leaf spring and as one piece with the flexible first printed circuit board 110.

So as to deflect the spring element 13 in a desirable predetermined manner, a suitable cut-out is embodied in the fifth printed circuit board 150 that is arranged on the first printed circuit board 110, wherein the fifth printed circuit board also has for this purpose a predetermined thickness. By means of the sixth printed circuit board 160 that is arranged on the fifth printed circuit board 150, a cover is provided on the fifth printed circuit board 150 having the cut-out 155 and it also covers the first printed circuit board 110 with respect to the outside.

The first printed circuit board 110 is arranged on the fourth printed circuit board 140, wherein for a desirable predetermined deflection of the spring element 13 the first printed circuit board 110 in a predetermined suitable section of the first printed circuit board 110 is not adhered to the fourth printed circuit board 140. A cut-out 145 is embodied in the fourth printed circuit board 140 and said cut-out accommodates the spherical contact element 12. The cut-out 145 is suitably embodied in this case in a cylindrical positive-locking manner with the spherical element 12.

The circular conductor track connection 12 lies on the upper edge of the contact element 12 with the result that the conductor track connection 112 is brought into contact with the contact element 12. The fourth printed circuit board 140 is arranged on the third printed circuit board 130 that likewise has a cylindrical cut-out 135, wherein the cut-out 135 is embodied in a tapered manner with respect to the cut-out 145 in the fourth printed circuit board 140. By means of this feature, the contact element 12 that is embodied as a sphere in a positive-locking manner with the cylindrical cut-out 135 is accommodated in the cut-out 145 and in so doing sits on the edge of the cut-out 135.

The third printed circuit board 130 has in so doing a comparatively small thickness with respect to the fourth printed circuit board 140. The third printed circuit board 130 is arranged on the second printed circuit board 120 in which a cut-out 15 is embodied and the mating area 14 of the plug connector 1 is provided by said cut-out. The second printed circuit board 120 is arranged in this case in a sandwich-like manner between the third printed circuit board 130 and the seventh printed circuit board 170, wherein the second printed circuit board 120 is arranged on a side of the seventh printed circuit board 170.

FIG. 1A illustrates in this case the plug connector 1 in the unplugged state, wherein the printed circuit board 20 that is to be contacted by means of the plug connector 1 is arranged on the plugging-in opening of the mating area 15. In this state of the plug connector, the contact element 12 extends with a section by a predetermined amount in part into the mating area 15. The mating area 15 of the plug connector 1 is arranged in this case parallel to the first printed circuit board 110.

The printed circuit board 20 that is located on the plugging-in opening of the mating area 15 has a conductor track 21 having a conductor track connection 212 that is provided in the same manner as the conductor track connection 112 of the first printed circuit board 110 by means of an edge of a circular cut-out 25 in the printed circuit board 20. The conductor track connection 212 is embodied and arranged in this case on the printed circuit board 20 in such a manner that the conductor track connection 212 is arranged in the plugged-in state of the printed circuit board 20 opposite the conductor track connection 112 of the first printed circuit board 110.

In the plugged-in state of the plug connector 1 that is illustrated in FIG. 1B, an electrical connection of the conductor track connection 212 to the conductor track connection 112 is provided by means of the contact element 12, wherein the contact element 12 is displaced in a perpendicular manner with respect to the printed circuit board 110 and the spring element 13 is deflected.

In so doing, the spring element 13 pushes the contact element 12 into the cut-out 25 that is embodied in a positive-locking manner with the contact element 12, with the result that a reliable electrical contact is provided and furthermore a latching arrangement to the printed circuit board that is to be contacted 20 is provided. Reference is made to the description above with respect to the plugging-in procedure as the printed circuit board 20 is plugged into the mating area. A particularly simple plug connector 1 for example is provided by means of the plug connector 1 shown in FIGS. 1A and B and so as to better understand the invention the first printed circuit board 110 of said plug connector also has for example in particular only one conductor track 11 having a conductor track connection 112.

The printed circuit boards 120, 130, 140, 150, 160 and 170 can be provided in a suitable manner by means of at least one copper-free standard printed circuit board. The second printed circuit board 120 can also be a synthetic material plate K2 that is arranged as illustrated in the drawing in a sandwich-like manner between a first K1 and third K3 synthetic material plate, wherein a cut-out 135, 145 that corresponds to the cut-outs 135 and 145 is embodied in the third K3 synthetic material plate. The fifth 150 and sixth 160 printed circuit board can be provided by means of a fourth synthetic material plate K4 that is arranged on the third synthetic material plate, wherein the synthetic material plate K4 is provided with the cut-out 155.

The plug connector can have for example in its area that is not illustrated in the drawings a cable that can be soldered to a further conductor track connection of the plug connector 1 and can be routed outwards from the housing of the plug connector 1.

The printed circuit board that is to be contacted 20 can be a component of a plug connector 2 that is embodied as a mating plug connector with respect to the plug connector 1.

FIG. 2 illustrates a sectional view through a section of a plug connector 1 according to one embodiment of the invention in the plugged-in state. The plug connector 1 shown in FIG. 2 has in a similar manner to the plug connector 1 shown in FIGS. 1A and B a second printed circuit board 120 in which a mating area 15 is formed by means of a cut-out having a plugging-in opening.

A first printed circuit board stack LS1 is arranged on the printed circuit board 120 and said printed circuit board stack has the above-described printed circuit boards 130, 140, 110, 150 and 160 that are stacked one above the other in this sequence on a side of the printed circuit board 120. The plug connector 2 shown in FIG. 2 corresponds to this extent to the plug connector 2 shown in FIGS. 1A and B and for this reason reference is made in this respect to the corresponding description above.

In a different manner to that of the plug connector 2 shown in FIGS. 1A and 1B, in the case of the plug connector 2 shown in FIG. 2 in lieu of the seventh printed circuit board 170 on its side of the second printed circuit board 120 a second printed circuit board stack LS1 is arranged in a mirror-inverted manner with respect to the first printed circuit board stack LS1, wherein the first and second printed circuit board stack LS1 are embodied in an identical manner.

The printed circuit board that is to be contacted 20 and is plugged into the inserting cut-out 15 of the plug connector 2 has, in a different manner to that of the printed circuit board 20 of the embodiment shown in FIGS. 1A and 1B, conductor tracks 11 and conductor track connections 212 embodied on both side so as to provide an electrical connection to the two conductor track connections 112 of the first printed circuit boards 110, said conductor track connections lying on opposite sides and being arranged in a mirror-symmetrical manner. Otherwise the printed circuit board 20 of the embodiment shown in FIG. 2 corresponds to the printed circuit board 20 shown in FIGS. 1A and B and for this reason reference is made in this respect to the corresponding description above.

The printed circuit board 20 of the embodiment shown in FIG. 2 can likewise be a component of a plug connector 2 according to one embodiment of the invention that can be embodied as a mating plug connector with respect to the plug connector 1. The plug connector 1 shown in FIG. 2 can be in its area not illustrated in the drawing for example as an above-mentioned plug connector 2 having a printed circuit board that is to be contacted 2 shown in FIG. 2.

Figure 3A:
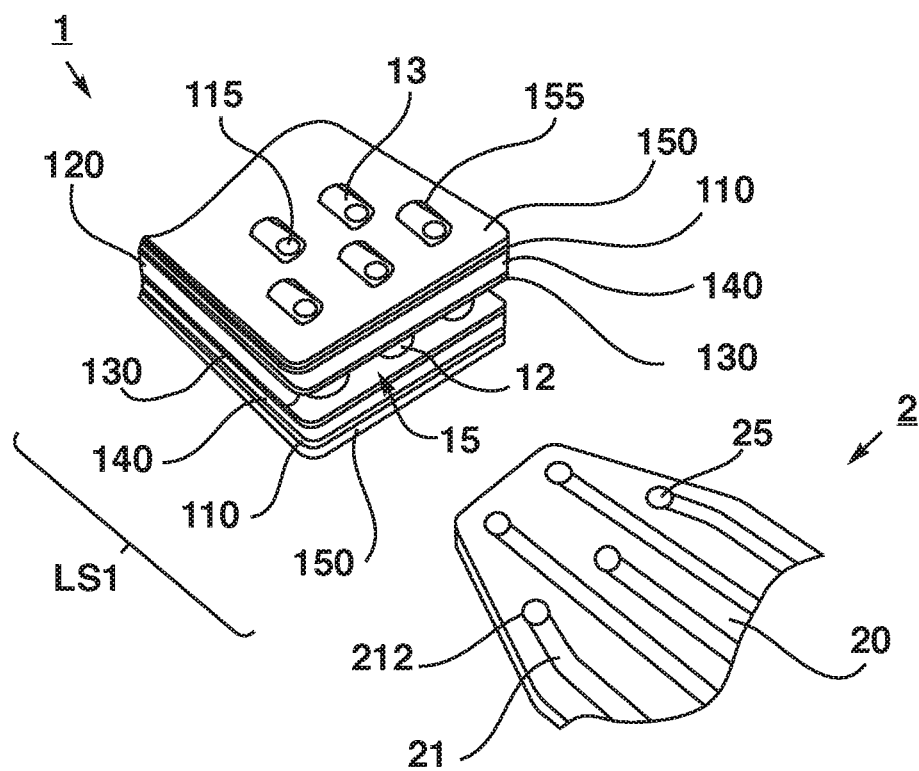
FIG. 3A illustrates a perspective view of a section of a first and second plug connector according to one embodiment of the invention.
Figure 3B:
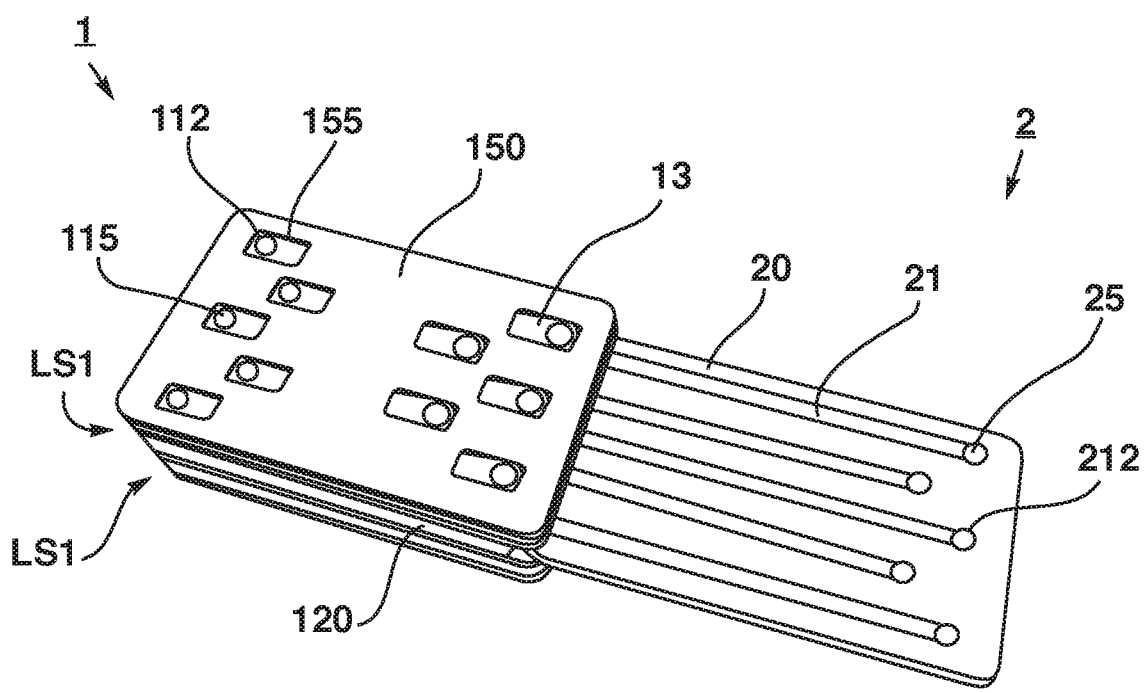
FIG. 3B illustrates in the plugged-in state the first and second plug connector shown in FIG. 3A.

FIG. 3A illustrates a perspective view of a section of a first 1 and second 2 plug connector according to one embodiment of the invention and FIG. 3B illustrates the first 1 and second 2 plug connector shown in FIG. 3A plugged one inside the other.

The printed circuit board stack of the plug connector 1 shown in FIGS. 3A and 3B corresponds essentially to the printed circuit board stack LS1 shown in FIG. 2 and for this reason reference is made in this respect to the corresponding description. For a better understanding, the sixth printed circuit board 160 is not illustrated in FIGS. 3A and 3B. In a different manner to that of the plug connector 1 shown in FIG. 2, the first printed circuit boards 10 of the plug connector 1 shown in FIGS. 3A and B have on the mating area 15 of the plug connector 1 in each case five spring elements 13 having five conductor track connections 112 having in each case a correspondingly allocated contact element 12.

For a better understanding, reference is made in this connection in addition to FIGS. 4A and 4C that illustrate in each case a plan view of the plugging-in opening of the mating area 15 of the plug connector 1 and of the printed circuit boards of the printed circuit board stack LS1 and in particular also of a first printed circuit board 110.

As an example, likewise embodied on the side of the plug connector 1 that lies opposite the mating area 15 of the plug connector 1 are five spring elements 13 with their allocated conductor track connections 112, which are arranged in two rows in each case in the plugging-in direction of a corresponding openings of the plug connector 1, said openings being embodied on the other side and are arranged spaced closer to one another than the rows of conductor track connections 112 that are arranged on the mating area 15 in a perpendicular manner with respect to the plugging-in direction. In so doing, the five conductor track connections 112 are connected in a simple manner in each case directly to an opposite-lying conductor track connection 112 by means of a conductor track 11. In this respect and with respect to the following description also of the mating area 15 of the plug connector 1, reference is also made again to FIG. 4C.

The mating area 15 that is embodied by means of a cut-out in the second printed circuit board 120 has an inner contour with a trapezoidal shape by means of which an advantageous mechanical coding of the plug connector 1 is provided, wherein it is ensured by means of the coding that only one contour of a mating area of a printed circuit board that is to be contacted 20 of a plug connector 2 can be plugged into the plug connector 1, said one contour corresponding to the inner contour of the mating area 15.

The printed circuit board 20 of the embodiment shown in FIGS. 3A and B has a corresponding contour that corresponds to the inner contour of the mating area and consequently likewise has an advantageous mechanical coding that matches the coding of the plug connector 1, whereupon such a printed circuit board 20 of a plug connector 2 can be plugged into the plug connector 1.

A housing of the plug connector 2 shown in FIGS. 3A and B is not illustrated in the drawings for the sake of clarity, wherein a suitable housing can be for example a first and second synthetic material plate, wherein the printed circuit board 20 can be arranged and accommodated in a sandwich-like manner between the first and second synthetic material plate.

Embodied on the side of the printed circuit board 20 that lies opposite the mating area of the second plug connector 2 are likewise five conductor track connections 212 and said five conductor track connections correspond to the five conductor track connections 212 that are arranged on the mating area, wherein the conductor track connections 212 as is best illustrated in FIG. 4B as an example are each connected in a simple manner by means of a conductor track 21 to an opposite-lying conductor track connection 212.

On the opposite-lying side of the printed circuit board 20, said side not illustrated in the drawing, in each case conductor tracks 21 and conductor track connections 212 can be arranged in a mirror-inverted manner with respect to the conductor tracks 21 and the conductor track connections 212 so as to provide in each case an electrical connection to the corresponding conductor track connections 112 that are provided on the two first printed circuit boards 110 of the first plug connector 1.

In the case of a particularly thick second printed circuit board 120 of the first plug connector 1, it is also possible to arrange a corresponding copper-free printed circuit board 22 as a spacer plate in a sandwich-like manner between two second printed circuit boards 20. For example, the printed circuit board 22 can have on the side that is lying opposite its mating area a comb-shaped structure having corresponding cut-outs that correspond to the arrangement of the conductor track connections 212. For example, the conductor track connections 212 that are arranged in the comb-like structure can be soldered to the cables that are not illustrated in the drawing and are routed out of the cut-outs of the comb-like structure and out of the housing that is likewise not illustrated.

The above description relating to the comb-like structure of the printed circuit board 22 that is embodied as a spacer plate also applies for the comb-like structure, that lies opposite the plugging-in opening 15, of the printed circuit board 120 of the first plug connector 2 whose conductor track connections 112 that lie opposite its mating area 15 are accessible via corresponding cut-outs in the comb-like structure. In this connection, reference is made here again to FIG. 4C, wherein the further printed circuit boards 130, 140 and 150 have in each case corresponding cut-outs 135, 145 and 155 that are described above with reference to FIGS. 1A and B. The printed circuit board 160 is a simple cover that is arranged on the fifth printed circuit board 150 and for better understanding is not illustrated in FIGS. 3A and 3B.

Figure 5A:
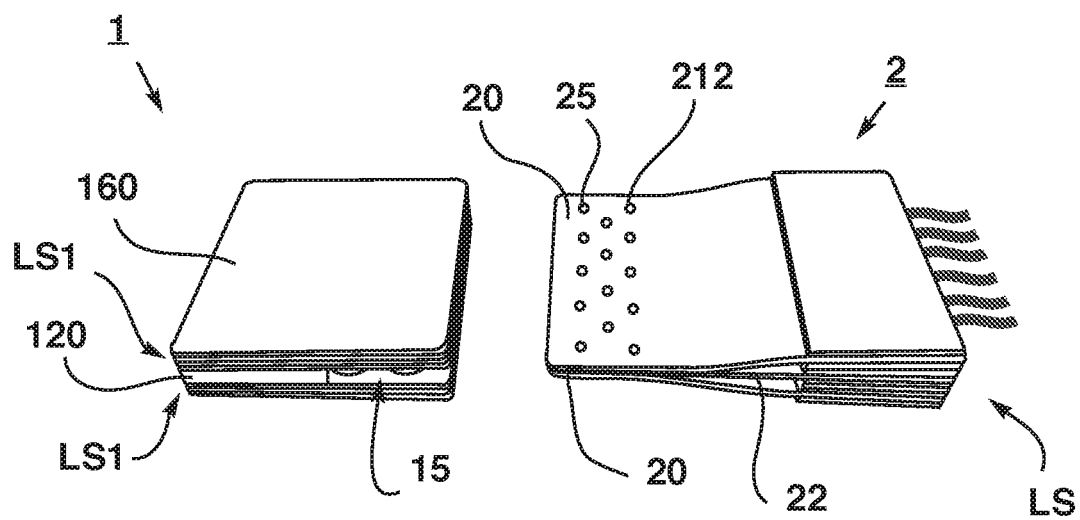
FIG. 5A illustrates a perspective view of a first and second plug connector according to one embodiment of the invention.
Figure 5B:
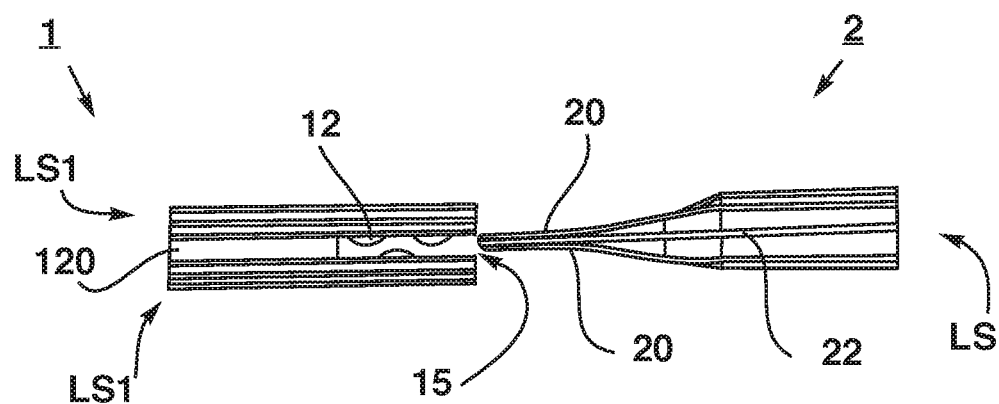
FIG. 5B illustrates a side view of the first and second plug connector shown in FIG. 5A.

FIG. 5A illustrates a perspective view of a first 1 and second 2 plug connector according to one embodiment of the invention and FIG. 5B illustrates a side view of the first 1 and second 2 plug connector shown in FIG. 5A, wherein the plug connector 2 has on the plugging-in opening 15 of the plug connector 1 that is embodied corresponding to the plug connector 1 shown in FIGS. 3A and 3B and in a different manner to that of the plug connector 1 shown in FIGS. 3A and B does not have a mechanical coding on its mating area and has corresponding to the plug connector 2 shown in FIGS. 5A and B a multiplicity of conductor track connections 112 having corresponding contact elements 12.

The plug connector 2 has a printed circuit board 22 that is arranged in the middle in the printed circuit board stack LS so as to space apart and stabilize the printed circuit boards 20 that are provided with conductor track connections 212, wherein the printed circuit board 22 is arranged in a sandwich-like manner between the printed circuit boards 20. It is clear that the conductor track connections 212 that are embodied in each case on the printed circuit boards 20 are arranged in such a manner that they can be contacted in the plugged-in state by the contact elements 12 of the plug connector 1.

As is the case with the above described first printed circuit board 110, the printed circuit boards 20 are flexible printed circuit boards 20 that are arranged in the mating area of the plug connector 2 adjacent to one another on both sides of the printed circuit board 22 with a corresponding space between one another and that are spaced further apart from one another in the housing that is provided by means of the printed circuit board stack LS out of the plane of the mating area. The conductor track connections 212 of the printed circuit boards 20 can be soldered to cables as illustrated in FIG. 5A on the side lying opposite the mating area of the plug connector 2, said cables being routed out of the housing.

By means of the above-described flexible printed circuit boards 20 that are arranged significantly spaced apart from one another in the housing, it is possible as an alternative to provide on the side of the plug connector 2 that is lying opposite the mating area a plug connector 1 according to one embodiment of the invention, said plug connector having a plugging-in opening 15, wherein the printed circuit board stack LS1 can be an above-described first and second printed circuit board stack LS1, wherein it is possible to provide two first printed circuit boards 110 by means of the flexible printed circuit boards 20.

The conductor tracks of the printed circuit boards 20 are not illustrated here for the sake of simplicity and clarity, wherein the conductor track connections 212 can also be allocated in a redundant manner in the plugging-in direction and/or in a perpendicular manner with respect to the plugging-in direction to a conductor track and/or multiple conductor tracks.

Figure 6A:
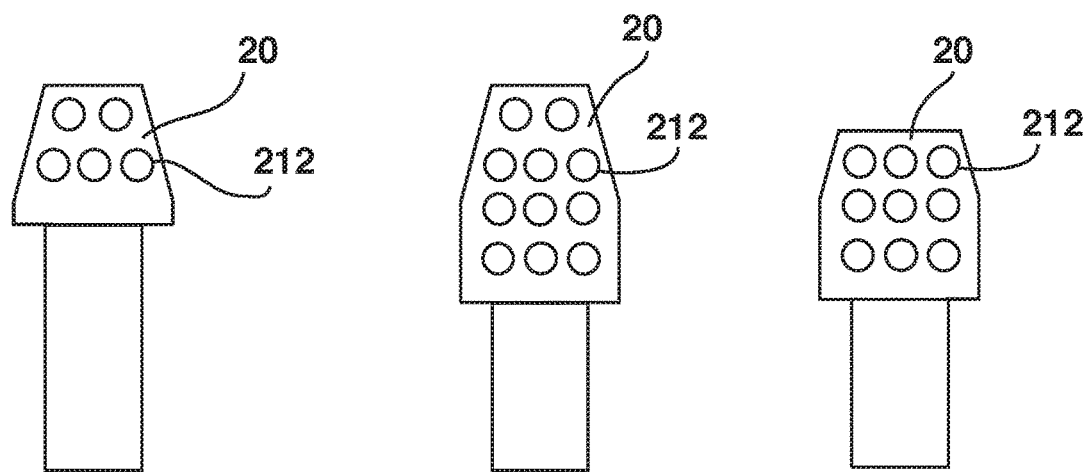
FIG. 6A illustrates schematic illustrations of embodiments of a plug connector according to one embodiment of the invention.
Figure 6B:
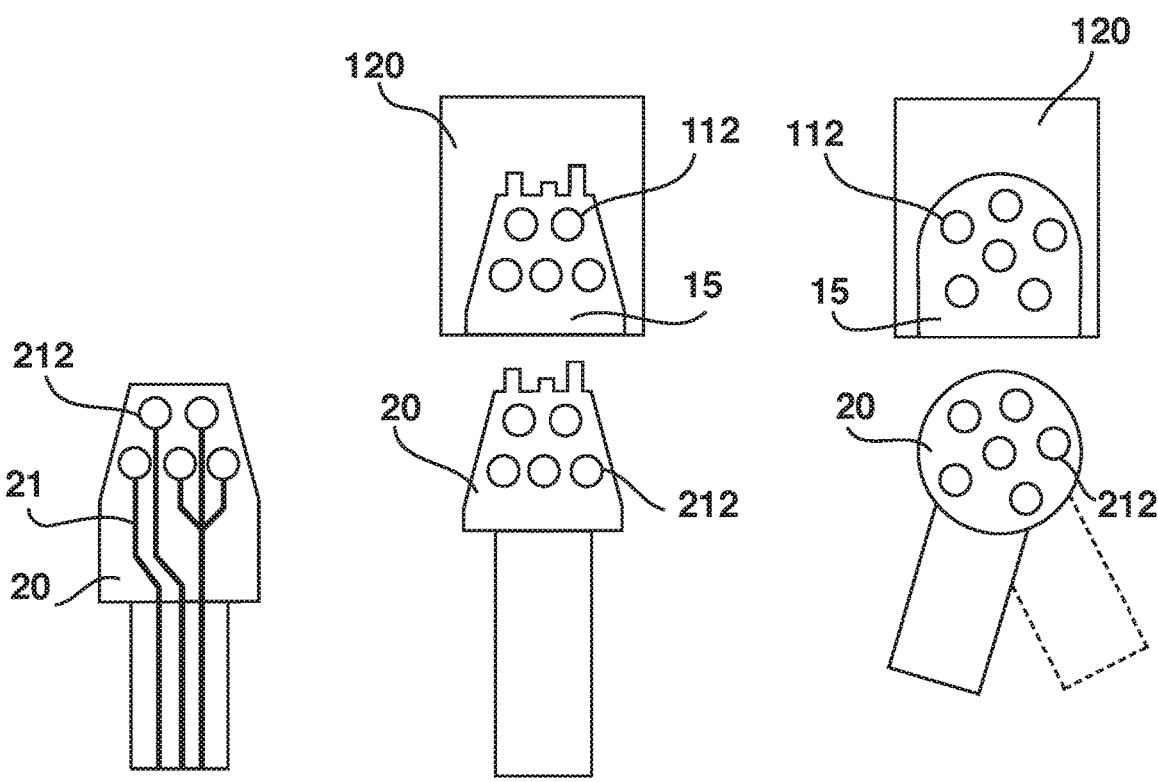
FIG. 6B illustrates schematic illustrations of embodiments of a first and second plug connector according to one embodiment of the invention.

FIG. 6A illustrates schematic views of embodiments of a plug connector 2 according to one embodiment of the invention, and FIG. 6B illustrates schematic views of embodiments of a first 1 and second 2 plug connector according to one embodiment of the invention, wherein in each case for better understanding only the printed circuit boards 20 and/or 120 is illustrated with contours of mating areas 15 and conductor track connections 112.

With the aid of the schematically illustrated embodiments, it is clear how a plug connector of one embodiment of the invention can also be modified as desired and optimized for many applications.

The printed circuit boards that are to be contacted 20 of a plug connector 2 shown in FIG. 6A are printed circuit boards that are embodied in each case with a mechanical coding, wherein the middle printed circuit board 20 can have a multiplicity of functions compared to the right-hand and left-hand printed circuit board 20 when plugging into a plug connector 1.

The left-hand and right-hand printed circuit board 20 shown in FIG. 6A are limited in this respect and differ from one another. For example, a plug connector 1 can be provided with a matching coding of its mating area 15 on a device, wherein by means of the plugged-in right-hand printed circuit board 20 it is possible to provide a testing mode of the device and by means of the left-hand printed circuit board 20 it is possible to provide an operating mode of the device and by means of the middle printed circuit board 20 it is possible to provide a servicing mode or programming mode of the device.

The above-mentioned statements also apply for the left-hand and middle printed circuit board 20 shown in FIG. 6B that are both coded in a mechanical manner, wherein the left-hand printed circuit board is also suitable in addition to the mating area that matches the middle printed circuit board 20 for further modified codings of the mating area 15, whereas the middle printed circuit board 20 only matches the mating area 15 that is illustrated above it. Accordingly, the conductor tracks 21 of the left-hand and middle printed circuit board 20 can also differ from one another, wherein for example the left-hand printed circuit board 20 has a conductor track 21 having three redundant conductor track connections 212.

The right-hand printed circuit board 20 shown in FIG. 6A and the mechanically coded mating area 15 that corresponds thereto has six conductor track connections 212 that are arranged in a spot-symmetrical manner, wherein the printed circuit board can be plugged in rotated in different ways, wherein the different plugging-in positions can release in each case predetermined different functions of a device on which a correspondingly contacted plug connector 1 is provided. It is clear that the right-hand printed circuit board 20 can also have on its other side corresponding conductor track connections 212, wherein the symmetrical printed circuit board rotated out of the plane of the drawing in the corresponding plugged-in state can also provide further functions.

Even if different aspects or features of the invention are illustrated in the figures in each case in combination, it is obvious to the person skilled in the art—unless otherwise indicated—that the illustrated and discussed combinations are not the only possible combinations. In particular, units or feature complexes of different exemplary embodiments that correspond to one another may be exchanged with one another.

LIST OF REFERENCE NUMERALS

1 Plug connector
110, 120, 130, 140, 150, 160, 170 (first, second, third, fourth, fifth, sixth, seventh) Printed circuit board
11 Conductor track
112 Conductor track connection
113 U-shaped cut-out
115 Cut-out
12 Contact element
13 Spring element, leaf spring
135 Cut-out
145 Cut-out
15 Mating area, cut-out
155 Cut-out
2 Plug connector
20 Printed circuit board
21 Conductor track
212 Conductor track connection
22 Printed circuit board
25 Cut-out
26 Edge, annular contact element
LS, LS1 Printed circuit board stack
K1, K2, K3, K4 (first, second, third, fourth) Synthetic material plate

The invention claimed is:
1. A plug connector (1) for providing an electrical connection to a conductor track connection (212) of a printed circuit board (20),
  wherein the plug connector (1) has a first printed circuit board (110) having a first conductor track connection (112);

wherein the plug connector (1) has a mating area (15) for plugging the printed circuit board (20) into the plug connector (1);

wherein the mating area (15) extends parallel to the first printed circuit board (110);

wherein a contact element (12) and/or a spring element (13) is provided in the plug connector (1);

wherein the mating area (15) and the contact element (12) and/or the spring element (13) are embodied and arranged in such a manner that in a plugged-in state of the plug connector (1) the printed circuit board (20) that is plugged into the mating area (15) is arranged parallel to the first printed circuit board (110) and the conductor track connection (212) is arranged opposite the first conductor track connection (112); and wherein an electrical connection of the first conductor track connection (112) to the conductor track connection (212) is provided by way of the contact element (12) and/or the spring element (13).

2. The plug connector (1) as claimed in claim 1, wherein the spring element (13) is embodied as one piece with the first printed circuit board (110), wherein the spring element (13) is a leaf spring element (13) that is provided by a U-shaped cut-out (113) that is embodied in the first printed circuit board (110), wherein the U-shaped cut-out (113) encompasses the spring element (13) and the first conductor track connection (112) is arranged on the spring element (13);

wherein a fourth synthetic material plate (K4; 150, 160) is arranged on the first printed circuit board (110) whereby a cover is provided on the first printed circuit board (110);

wherein the first printed circuit board (110) has a predetermined amount of flexibility; and wherein a cut-out (155) for accommodating the deflected spring element (13) is embodied in the fourth synthetic material plate (K4; 150, 160).

3. The plug connector (1) as claimed in claim 1, wherein the first conductor track connection (112) is an edge of a cut-out (115) that is embodied in the first printed circuit board (110); and wherein the contact element (12) has a contour that cooperates with the first conductor track connection (112); and wherein the edge of the cut-out (115) can be embodied in a circular manner and the contact element (12) can be embodied in a spherical manner.

4. The plug connector (1) as claimed in claim 1, comprising a plurality of conductor tracks (11) and/or first conductor track connections (112) and/or spring elements (13) and/or contact elements (12) and/or cut-outs (135) and/or cut-outs (145) and/or cut-outs (113) and/or cut-outs (115) and/or cut-outs (155).

5. The plug connector (1) as claimed in claim 1, wherein the mating area (15) has an inner contour by means of which the plug connector (1) is provided with a coding.

6. The plug connector (1) as claimed in claim 1, wherein a housing of the plug connector (1) is provided by the first (110), second (120), third (130), fourth (140), fifth (150), sixth (160) and seventh (170) printed circuit board and/or by the first (K1; 170), second (K2; 120), third (K3; 130, 140) and fourth (K4; 150, 160) synthetic material plate and the first printed circuit board (110), wherein the first printed circuit board (110) can be populated with electrical and/or electronic components, wherein cut-outs for accommodating the components are embodied in the third (K3; 130, 140) and/or the fourth (K4; 150, 160) synthetic material plate and/or in the fourth (140) and/or fifth (150) printed circuit board.

7. The plug connector (1) as claimed in claim 1, wherein the mating area (15) is a cut-out that is embodied in a second synthetic material plate (K2; 120) and is arranged in a sandwich-like manner between a first (K1; 170) and third synthetic material plate (K3; 130, 140); and wherein the first printed circuit board (110) is arranged on the third synthetic material plate (K3; 130, 140); and wherein a cut-out (135, 145) for accommodating the contact element (12) and/or the spring element (13) is embodied in the third synthetic material plate (K3; 130, 140).

8. The plug connector (1) as claimed in claim 7, wherein the second synthetic material plate (K2; 120) is provided by a second printed circuit board (120); and the third synthetic material plate (K3; 130, 140) is provided by a third (130) and fourth (140) printed circuit board, wherein a cut-out (145) is embodied in the fourth printed circuit board (140) and a cut-out (135) that tapers with respect to the cut-out (145) is embodied in the third printed circuit board (130), and wherein the cut-out (135, 145) is formed by the cut-out (135) and the cut-out (145); and the fourth synthetic material plate (K4; 150, 160) is provided by a fifth (150) and sixth (160) printed circuit board, wherein the cut-out (155) is embodied in the fifth printed circuit board (150); and the third (130) and fourth (140) and first (110) and fifth (150) and sixth (160) printed circuit board arranged one above the other in this sequence form a printed circuit board stack (LS1), wherein a first printed circuit board stack (LS1) is arranged on a side of the second printed circuit board (120), wherein the first synthetic material plate (K1; 170) can be provided by a seventh printed circuit board (170) or a second printed circuit board stack (LS1) that is arranged on the other side of the second printed circuit board (120).

9. A plug connector (2), for providing an electrical connection of a conductor track connections (212) of a printed circuit board (20) to a further printed circuit board (1), wherein the printed circuit board (20) is a component of the plug connector (2);

wherein the plug connector (2) has a housing having at least two synthetic material plates, wherein the housing can be provided in form of a printed circuit board stack (LS); and wherein the printed circuit board (20) is arranged in a sandwich-like manner between the at least two synthetic material plate or in the printed circuit board stack (LS) and protrudes out of the housing of the plug connector (2) so as to plug into a mating area (15) of a further plug connector (1) on the further printed circuit board (1), wherein the conductor track connection (212) is provided by an edge of a cut-out (25) that is embodied in the printed circuit board (20), wherein by the conductor track connection (212) it is furthermore possible to provide a latching element so as to latch with the further plug connector (1).

10. The plug connector (2) as claimed in claim 9, comprising
a plurality of conductor tracks (21) and/or conductor track connections (212) and/or cut-outs (25), wherein the conductor tracks (21) and/or the conductor track connections (212) can be embodied on both sides of the printed circuit board (20).

11. The plug connector (2) as claimed in claim 9,
wherein the printed circuit board (20) can be populated with electrical and/or electronic components,
wherein cut-outs for accommodating the components are embodied in the housing of the plug connector (2).

12. The plug connector (2) as claimed in claim 9,
wherein the printed circuit board (20) has a contour by means of which the plug connector (2) is provided with a coding,
wherein the contour is embodied so as to correspond with the inner contour of a mating area (15) of the plug connector (1).

13. The plug connector (2) as claimed in claim 9, comprising
two printed circuit boards (20) that are assembled arranged one above the other, wherein their sides that are provided with a conductor track connection (212) are arranged opposite one another.

14. A printed circuit board,
wherein embodied on an edge of the printed circuit board is at least one plug connector (1) for providing an electrical connection to a conductor track connection (212) of a further printed circuit board (20),
wherein the plug connector (1) has a first printed circuit board (110) having a first conductor track connection (112);
wherein the plug connector (1) has a mating area (15) for plugging the further printed circuit board (20) into the plug connector (1);
wherein the mating area (15) extends parallel to the first printed circuit board (110);
wherein a contact element (12) and/or a spring element (13) is provided in the plug connector (1);
wherein the mating area (15) and the contact element (12) and/or the spring element (13) are embodied and arranged in such a manner that in a plugged-in state of the plug connector (1) the printed circuit board (20) that is plugged into the mating area (15) is arranged parallel to the first printed circuit board (110) and the conductor track connection (212) is arranged opposite the first conductor track connection (112); and
wherein an electrical connection of the first conductor track connection (112) to the conductor track connection (212) is provided by way of the contact element (12) and/or the spring element (13),
wherein the printed circuit board can be one piece with the first printed circuit board (110) and/or the further printed circuit board (20).

15. A printed circuit board,
wherein embodied on an edge of the printed circuit board is at least one plug connector (2) for providing an electrical connection of a conductor track connections (212) of the printed circuit board (20) to a further printed circuit board (1),
wherein the printed circuit board (20) is a component of the plug connector (2);
wherein the plug connector (2) has a housing having at least two synthetic material plates, wherein the housing can be provided by means of a printed circuit board stack (LS); and
wherein the printed circuit board (20) is arranged in a sandwich-like manner between the at least two synthetic material plate or in the printed circuit board stack (LS) and protrudes out of the housing of the plug connector (2) so as to plug into a mating area (15) of a further plug connector (1) on the further printed circuit board (1),
wherein the conductor track connection (212) is provided by an edge of a cut-out (25) that is embodied in the printed circuit board (20),
wherein by the conductor track connection (212) it is furthermore possible to provide a latching element so as to latch with the plug connector (1).

* * * * *